United States Patent
Tang

(10) Patent No.: US 10,418,590 B2
(45) Date of Patent: Sep. 17, 2019

(54) OLED FLEXIBLE DISPLAY PANEL AND METHOD FOR MANUFACTURING THE SAME

(71) Applicant: WUHAN CHINA STAR OPTOELECTRONICS SEMICONDUCTOR DISPLAY TECHNOLOGY CO., LTD., Wuhan, Hubei (CN)

(72) Inventor: Fan Tang, Hubei (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 15/735,621

(22) PCT Filed: Sep. 4, 2017

(86) PCT No.: PCT/CN2017/100339
§ 371 (c)(1),
(2) Date: Dec. 12, 2017

(87) PCT Pub. No.: WO2019/019263
PCT Pub. Date: Jan. 31, 2019

(65) Prior Publication Data
US 2019/0036076 A1    Jan. 31, 2019

(30) Foreign Application Priority Data
Jul. 25, 2017 (CN) .................. 2017 1 06029359

(51) Int. Cl.
*H01L 51/52* (2006.01)
*H01L 51/00* (2006.01)
*H01L 51/56* (2006.01)

(52) U.S. Cl.
CPC ...... *H01L 51/5256* (2013.01); *H01L 51/0097* (2013.01); *H01L 51/56* (2013.01);
(Continued)

(58) Field of Classification Search
CPC .. H01L 51/5256; H01L 51/0097; H01L 51/56
(Continued)

(56) References Cited

U.S. PATENT DOCUMENTS

2015/0102326 A1* 4/2015 An .................. H01L 51/5256
257/40
2015/0137131 A1   5/2015 Kim
(Continued)

FOREIGN PATENT DOCUMENTS

CN    104269426 A    1/2015
CN    104538425 A    4/2015
(Continued)

*Primary Examiner* — Long K Tran
(74) *Attorney, Agent, or Firm* — Mark M. Freidman

(57) ABSTRACT

The present disclosure provides an organic light-emitting diode (OLED) flexible display panel, comprising a flexible substrate, an OLED luminescent structure, a bulk inorganic layer, a first organic layer, a first sub-body mixing layer, a second organic layer, and a second sub-body mixing layer. The first sub-body mixing layer includes a first inorganic film and a first dividing film that are alternately arranged, and the second sub-body mixing layer includes a second inorganic film and a second dividing film that are alternately arranged.

7 Claims, 2 Drawing Sheets

(52) U.S. Cl.
CPC .. *H01L 2251/301* (2013.01); *H01L 2251/303* (2013.01); *H01L 2251/5338* (2013.01)

(58) Field of Classification Search
USPC .......................................................... 257/40
See application file for complete search history.

(56) References Cited

U.S. PATENT DOCUMENTS

| | | |
|---|---|---|
| 2016/0254489 A1 | 9/2016 | Sun et al. |
| 2017/0025640 A1 | 1/2017 | Kim et al. |
| 2017/0125734 A1* | 5/2017 | Lee ..................... H01L 27/3246 |
| 2018/0047791 A1* | 2/2018 | Tsai ..................... H01L 27/322 |
| 2018/0123087 A1 | 5/2018 | Tang |

FOREIGN PATENT DOCUMENTS

| | | |
|---|---|---|
| CN | 104576959 A | 4/2015 |
| CN | 104659054 A | 5/2015 |
| CN | 105938873 A | 9/2016 |

\* cited by examiner

OLED FLEXIBLE DISPLAY PANEL AND METHOD FOR MANUFACTURING THE SAME

FIELD OF THE DISCLOSURE

The present disclosure relates to the field of flexible display panel, and more particularly to an organic light-emitting diode (OLED) flexible display panel and a method for manufacturing the same.

BACKGROUND

Currently, organic light-emitting diode (OLED) display panels are encapsulated by a film, where the encapsulation film is a multi-layer inorganic film or a mutli-layer composed of alternating layers of deposited inorganic films and organic films. Inorganic films are dense, and inorganic films are difficult to bend because of generation of film stress during deposition. Thus, inorganic film is liable to crack and peel.

In addition, to prevent water and oxygen from penetrating into OLED display panels, inorganic films are required to have a certain degree of thickness to block water and oxygen. However, increase of thickness of inorganic film would aggravate likelihood of occurrence of cracking and peeling. In particular, for OLED flexible display panels, once the OLED flexible display panels are bended or folded, it is very likely that the inorganic film would experience cracking or peeling, causing failure of the OLED flexible display panels in devices.

Therefore, to solve the problems encountered by the prior art, there is a need to provide an OLED flexible display panel and a method for manufacturing the same.

SUMMARY OF THE DISCLOSURE

The objective of the present disclosure is to provide an organic light-emitting diode (OLED) flexible display panel and a method for manufacturing the same, which is difficult to crack or peel, so as to solve the problems encountered by the prior art where the inorganic film in the OLED flexible display panel is liable to crack and peel during bending process of OLED flexible display panel.

The present disclosure provides an OLED flexible display panel, comprising:
a flexible substrate;
an OLED luminescent structure disposed on the flexible substrate;
a bulk inorganic layer disposed on the OLED luminescent structure;
a first organic layer disposed on the bulk inorganic layer;
a first sub-body mixing layer disposed on the first organic layer, wherein the first sub-body mixing layer comprises a first inorganic film and a first dividing film that are alternately arranged;
a second organic layer disposed on the first sub-body mixing layer; and
a second sub-body mixing layer disposed on the second organic layer, wherein the second sub-body mixing layer comprises a second inorganic film and a second dividing film that are alternately arranged;
wherein the first dividing film is an inorganic film or an organic film having an elastic modulus less than an elastic modulus of the first inorganic film;
wherein the second dividing film is an inorganic film or an organic film having an elastic modulus less than an elastic modulus of the second inorganic film; and
wherein a length of the first inorganic film is greater than a length of the first dividing film; a length of the second inorganic film is greater than a length of the second dividing film; and a projection of the first dividing film on a plane of the flexible substrate does not overlap a projection of the second dividing film on the plane of the flexible substrate.

In accordance with the OLED flexible display panel of the present disclosure, the bulk inorganic layer is disposed on the OLED luminescent structure by an atomic layer deposition process.

In accordance with the OLED flexible display panel of the present disclosure, the first organic layer is disposed on the bulk inorganic layer by a coating process or an ink printing process; and the second organic layer is disposed on the first sub-body mixing layer by a coating process or an ink printing process.

In accordance with the OLED flexible display panel of the present disclosure, the bulk inorganic layer is an aluminum oxide layer or a silicon nitride layer; the first organic layer and the second organic layer are selected from an acrylate-based polymer layer, styrene-based polymer layer, or an organic silicon-based polymer layer; and the first inorganic film and the second inorganic film are selected from an aluminum oxide layer, a silicon nitride layer, a silicon oxide layer, or a silicon carbide layer.

In accordance with the OLED flexible display panel of the present disclosure, the OLED flexible display panel further comprises an inorganic protective layer disposed between the OLED luminescent structure and the bulk inorganic layer.

The present disclosure further provides an OLED flexible display panel, comprising:
a flexible substrate;
an OLED luminescent structure disposed on the flexible substrate;
a bulk inorganic layer disposed on the OLED luminescent structure;
a first organic layer disposed on the bulk inorganic layer;
a first sub-body mixing layer disposed on the first organic layer, wherein the first sub-body mixing layer comprises a first inorganic film and a first dividing film that are alternately arranged;
a second organic layer disposed on the first sub-body mixing layer; and
a second sub-body mixing layer disposed on the second organic layer, wherein the second sub-body mixing layer comprises a second inorganic film and a second dividing film that are alternately arranged;
wherein the first dividing film n is an inorganic film or an organic film having an elastic modulus less than an elastic modulus of the first inorganic film; and
wherein the second dividing film is an inorganic film or an organic film having an elastic modulus less than an elastic modulus of the second inorganic film.

In accordance with the OLED flexible display panel of the present disclosure, a length of the first inorganic film is greater than a length of the first dividing film, and a length of the second inorganic film is greater than a length of the second dividing film.

In accordance with the OLED flexible display panel of the present disclosure, a projection of the first dividing film on a plane of the flexible substrate does not overlap a projection of the second dividing film on the plane of the flexible substrate.

In accordance with the OLED flexible display panel of the present disclosure, the bulk inorganic layer is disposed on the OLED luminescent structure by an atomic layer deposition process.

In accordance with the OLED flexible display panel of the present disclosure, the first organic layer is disposed on the bulk inorganic layer by a coating process or an ink printing process; and the second organic layer is disposed on the first sub-body mixing layer by a coating process or an ink printing process.

In accordance with the OLED flexible display panel of the present disclosure, the bulk inorganic layer is an aluminum oxide layer or a silicon nitride layer; the first organic layer and the second organic layer are selected from an acrylate-based polymer layer, a styrene-based polymer layer, or an organic silicon-based polymer layer; and the first inorganic film and the second inorganic film are selected from an aluminum oxide layer, a silicon nitride layer, a silicon oxide layer, or a silicon carbide layer.

In accordance with the OLED flexible display panel of the present disclosure, the OLED flexible display panel further comprises:

an inorganic protective layer disposed between the OLED luminescent structure and the bulk inorganic layer.

The present disclosure additionally provides a method for manufacturing an OLED flexible display panel, comprising steps of:

providing a flexible substrate;
forming an OLED luminescent structure on the flexible substrate;
forming a bulk inorganic layer on the flexible substrate using an atomic layer deposition process;
forming a first organic layer on the flexible substrate using a coating process or an ink printing process;
forming a first inorganic film on the flexible substrate through a first mask;
forming a first dividing film on the flexible substrate through a second mask, wherein the first dividing film and the first inorganic film constitute a first sub-body mixing layer;
forming a second organic layer on the flexible substrate using a coating process or an ink printing process;
forming a second inorganic film on the flexible substrate through a third mask; and
forming a second dividing film on the flexible substrate through a fourth mask, wherein the second dividing film and the second inorganic film constitute a second sub-body mixing layer;
wherein the first dividing film is an inorganic film or an organic film having an elastic modulus less than an elastic modulus of the first inorganic film; and
wherein the second dividing film is an inorganic film or an organic film having an elastic modulus less than an elastic modulus of the second inorganic film.

In accordance with the method for manufacturing the OLED flexible display panel of the present disclosure, a length of the first inorganic film is greater than a length of the first dividing film, and a length of the second inorganic film is greater than a length of the second dividing film.

In accordance with the method for manufacturing the OLED flexible display panel of the present disclosure, a projection of the first dividing film on a plane of the flexible substrate does not overlap a projection of the second dividing film on the plane of the flexible substrate.

According to the OLED flexible display panel and the method for manufacturing the same of the present disclosure, because a laminate structure having sub-body inorganic layers and organic layers is formed in the OLED flexible display panel to block water and oxygen, it is difficult for the inorganic film in the OLED flexible display panel to crack or peel, thus solving the problems encountered by the prior art where the inorganic film in the OLED flexible display panel is liable to crack and peel during bending process of OLED flexible display panel.

BRIEF DESCRIPTION OF THE DRAWINGS

In order to more clearly illustrate the technical schemes according to the embodiments of the present disclosure, the following description makes brief description for the drawings used in the embodiments of the present disclosure. Apparently, the drawings illustrated below are only some embodiments of the invention. For those of ordinary skill in the art can also obtain other drawings based on these drawings without additional creative labor, in which.

DETAILED DESCRIPTION

The following provides clear and complete description of the embodiments with reference to the appended drawings. However, the described embodiments are just part, rather than all, of embodiments of the present disclosure. Any other embodiments obtained by those of ordinary skill in the art based on the embodiments of the present disclosure are intended to be protected by the subject invention.

Figure 1:
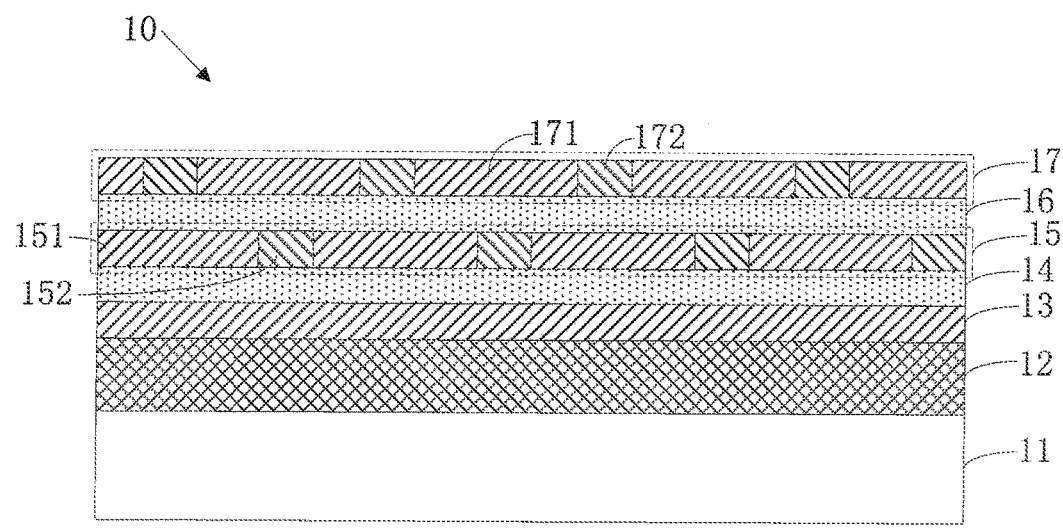
FIG. 1 is a schematic diagram showing a structure of an OLED flexible display panel according to a first preferred embodiment of the present disclosure.

Please refer to FIG. 1, which is a schematic diagram showing a structure of an OLED flexible display panel according to a first preferred embodiment of the present disclosure. The organic light-emitting diode (OLED) 10 according to this preferred embodiment includes a flexible substrate 11, an OLED luminescent structure 12, a bulk inorganic layer 13, a first organic layer 14, a first sub-body mixing layer 15, a second organic layer 16, and a second sub-body mixing layer 17.

The OLED luminescent structure 12 is disposed on the flexible substrate 11. The bulk inorganic layer 13 is disposed on the OLED luminescent structure 12. The first organic layer 14 is disposed on the bulk inorganic layer 13. The first sub-body mixing layer 15 is disposed on the first organic layer 14, where the first sub-body mixing layer 15 includes a first inorganic film 151 and a first dividing film 152 that are alternately arranged. The second organic layer 16 is disposed on the first sub-body mixing layer 15. The second sub-body mixing layer 17 is disposed on the second organic layer 16, where the second sub-body mixing layer 17 includes a second inorganic film 171 and a second dividing film 172 that are alternately arranged.

The first dividing film 152 is an inorganic film or an organic film having an elastic modulus less than an elastic modulus of the first inorganic film 151. The second dividing film 172 is an inorganic film or an organic film having an elastic modulus less than an elastic modulus of the second inorganic film 171.

The flexible substrate 11 can be made of ultra-thin glass or polymer. The OLED luminescent structure 12 includes elements such as an anode, a hole injection layer, a hole transport layer, a light-emitting layer, an electron transport layer, an electron injection layer and a cathode, etc.

Specifically, the bulk inorganic layer 13 can be disposed on the OLED luminescent structure 12 using an atomic layer deposition (ALD) process. As such, the bulk inorganic layer 13 constitutes an inorganic particulate cover on the surface of the OLED luminescent structure 12, which is used as an ultra-thin and dense moisture-blocking layer. The bulk inorganic layer 13 can be an aluminum oxide ($Al_2O_3$) layer or a silicon nitride ($SiN_x$) layer. The bulk inorganic layer 13 has a thickness ranging from 10 nanometer to 500 nanometer.

The first organic layer 14 can he disposed on the bulk inorganic layer 13 using a coating process or an ink printing process. The first organic layer 14 can be an acrylate-based polymer layer, a styrene-based polymer layer, or an organic silicon-based polymer layer. The first organic layer 14 is not only functioned to planarize to the bulk inorganic layer 13 but used as a buffer layer for releasing stress existing in adjacent inorganic layers. The first organic layer 14 has a thickness ranging from 5 micrometer to 10 micrometer.

Similarly, the second organic layer 16 can be disposed on the first sub-body mixing layer 15 using a coating process or an ink printing process. The second organic layer 16 can be an acrylate-based polymer layer, a styrene-based polymer layer, or an organic silicon-based polymer layer. The second organic layer 16 is not only functioned to planarize the first sub-body mixing layer 15 but used as a buffer layer for releasing stress existing in adjacent inorganic layers. The second organic layer 16 has a thickness ranging from 5 micrometer to 10 micrometer.

The first sub-body mixing layer 15 can be formed by executing steps of: forming the first inorganic film 151 of the first sub-body mixing layer 15 on the first organic layer 14 through a first mask having a pattern of the first inorganic film; and then forming the first dividing film 152 of the first sub-body mixing layer 15 on the first organic layer 14 through a second mask having a pattern of the first dividing film, where a length of the first inorganic film 151 in bending direction of the OLED flexible display panel 10 is greater than a length of the first dividing film 152 in bending direction of the OLED flexible display panel 10. The thickness of the first inorganic film 151 can be the same as or different from that of the first dividing film 152.

Therefore, a first sub-body mixing layer 15 having a soft-rigid-soft-rigid structure is formed. The first dividing film 152 of the first sub-body mixing layer 15 has a small elastic modulus, therefore, during bending process of the OLED flexible display panel 10, the first dividing film 152 can absorb tensile stress or compressive stress existing in the first sub-body mixing layer 15 and adjacent structures, so as to avoid the first sub-body mixing layer 15 from cracking or peeling. The first inorganic film 151 of first sub-body mixing layer 15 can be an aluminum oxide layer, a silicon nitride layer, a silicon oxide layer, or a silicon carbide layer. The first dividing film 152 of the first sub-body mixing layer 15 can be an organic film (such as an acrylate-based polymer layer, a styrene-based polymer layer, an organic silicon-based polymer layer, etc.) or an inorganic film (such as an aluminum oxide layer, a silicon nitride layer, a silicon oxide layer, a silicon carbide layer, etc.). The first inorganic film 151 and the first dividing film 152 of the first sub-body mixing layer 15 each has a thickness ranging from 0.1 micrometer to 10 micrometer.

The second sub-body mixing layer 17 can be formed by executing steps of: forming the second inorganic film 171 of the second sub-body mixing layer 17 on the second organic layer 16 through a third mask having a pattern of the second inorganic film; and then forming the second dividing film 172 of the second sub-body mixing layer 17 on the second organic layer 16 through a fourth mask having a pattern of the second dividing film, where a length of the second inorganic film 171 in bending direction of the OLED flexible display panel 10 is greater than a length of the second dividing film 172 in bending direction of the OLED flexible display panel 10. The thickness of the second inorganic film 171 can be the same as or different from that of the second dividing film 172.

Therefore, a second sub-body mixing layer 17 having a soft-rigid-soft-rigid structure is formed. The second dividing film 172 of the second sub-body mixing layer 17 has a small elastic modulus, therefore, during bending process of the OLED flexible display panel 10, the second dividing film 172 can absorb tensile stress or compressive stress existing in the second sub-body mixing layer 17 and adjacent structures, so as to avoid the second sub-body mixing layer 17 from cracking or peeling. The second inorganic film 171 of second sub-body mixing layer 17 can be an aluminum oxide layer, a silicon nitride layer, a silicon oxide layer, or a silicon carbide layer. The second dividing film 172 of the second sub-body mixing layer 17 can be an organic film (such as an acrylate-based polymer layer, a styrene-based polymer layer, an organic silicon-based polymer layer, etc.) or an inorganic film (such as an aluminum oxide layer, a silicon nitride layer, a silicon oxide layer, a silicon carbide layer, etc.). The second inorganic film 171 and the second dividing film 172 of the second sub-body mixing layer 17 each has a thickness ranging from 0.1 micrometer to 10 micrometer.

A projection of the first dividing film 152 on a planar plane (or curved plane) of the flexible substrate 11 does not overlap a projection of the second dividing film 172 on the planar plane (or curved plane) of the flexible substrate 11. This makes the first sub-body mixing layer 15 and the second sub-body mixing layer 17 eliminate stresses at different regions of the OLED flexible display panel, respectively, therefore operation stability of the OLED flexible display panel 10 is increased.

Figure 2:
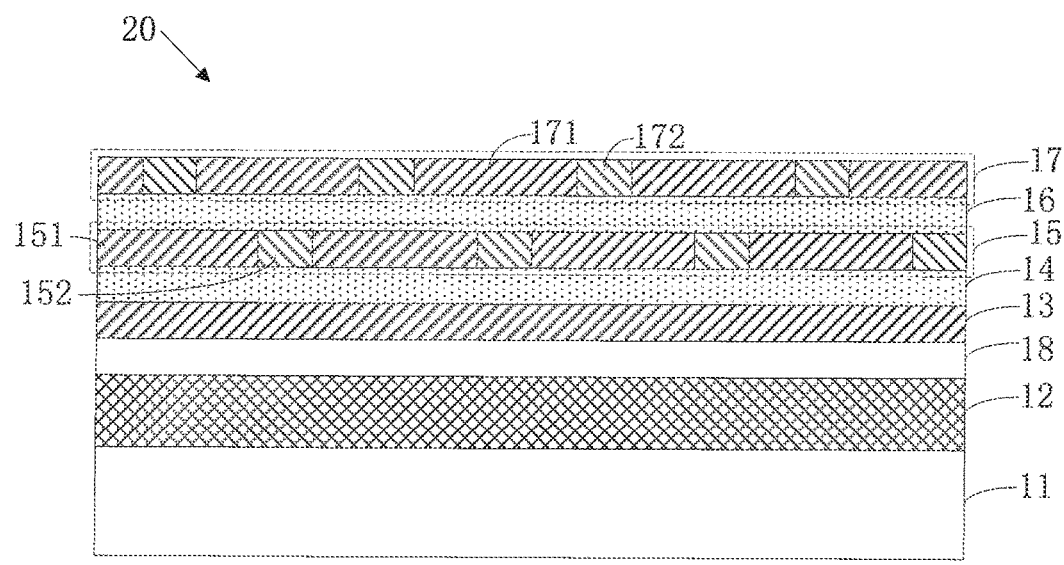
FIG. 2 is a schematic diagram showing a structure of an OLED flexible display panel according to a second preferred embodiment of the present disclosure.

Preferably, an inorganic protective layer 18 is further disposed between the OLED luminescent structure 12 and the bulk inorganic layer 13 for protecting the OLED luminescent structure 12. The inorganic protective layer 18 can be made of LiF that is formed by thermal evaporation. As shown in FIG. 2 which is a schematic diagram showing a structure of an OLED flexible display panel according to a second preferred embodiment of the present disclosure, the OLED flexible display panel further includes an inorganic protective layer 18.

According to this preferred embodiment, because a laminate structure having sub-body inorganic layers and organic layers is formed in the OLED flexible display panel to block water and oxygen, it is difficult for the inorganic film in the OLED flexible display panel to crack or peel.

Figure 3:
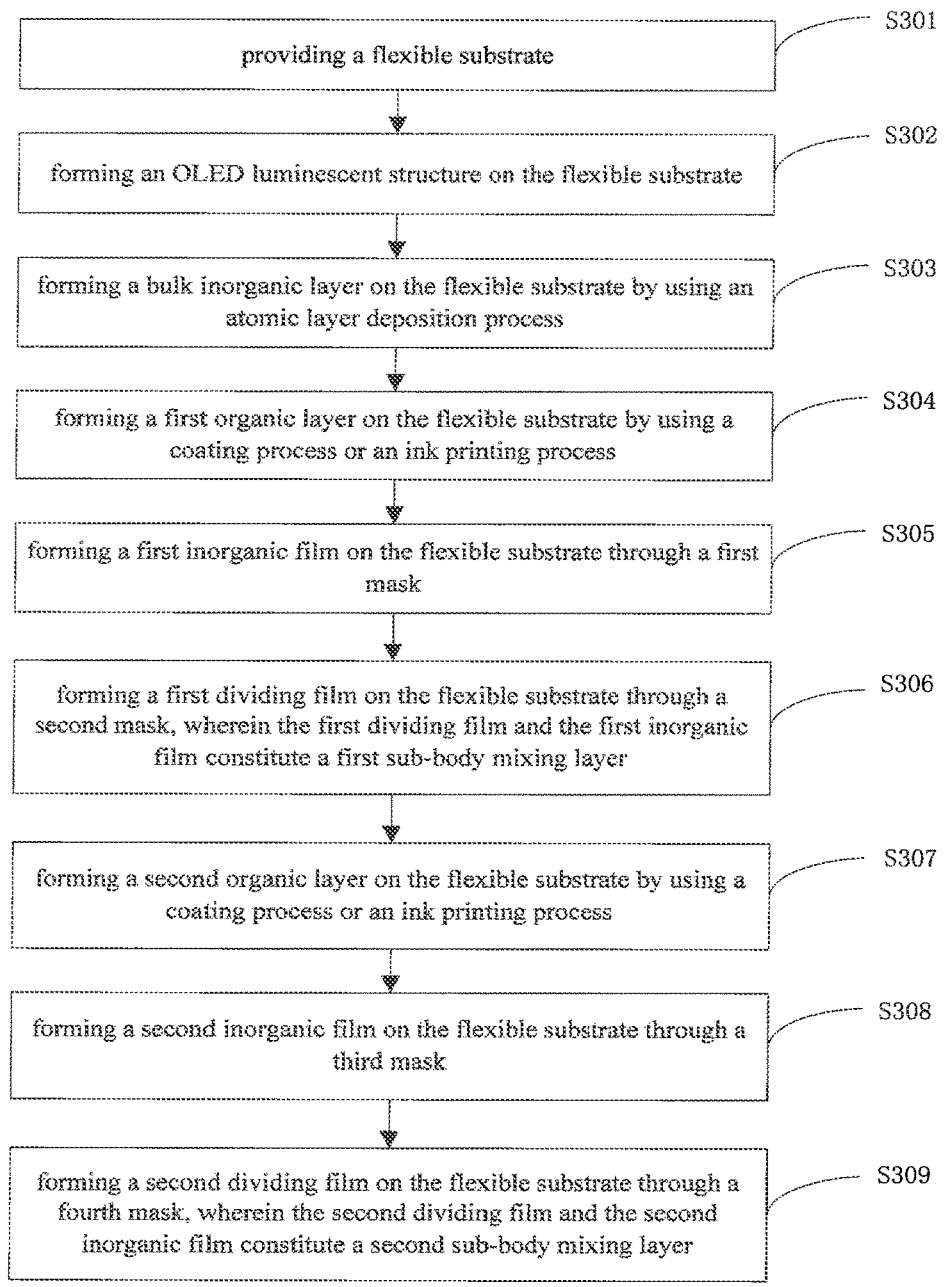
FIG. 3 is a flow chart showing a method for manufacturing an OLED flexible display panel according to an embodiment of the present disclosure.

The present disclosure further provides a method for manufacturing an organic light-emitting diode (OLED) flexible display panel. Please refer to FIG. 3, which is a flow chart showing a method for manufacturing an OLED flexible display panel according to an embodiment of the present disclosure. The method for manufacturing an OLED flexible display panel according to this embodiment includes:

a step S301 of providing a flexible substrate;

a step S302 of forming an OLED luminescent structure on the flexible substrate;

a step S303 of forming a bulk inorganic layer on the flexible substrate using an atomic layer deposition process;

a step S304 of forming a first organic layer on the flexible substrate using a coating process or an ink printing process;

a step S305 of forming a first inorganic film on the flexible substrate through a first mask;

a step S306 of forming a first dividing film on the flexible substrate through a second mask, wherein the first dividing film and the first inorganic film constitute a first sub-body mixing layer;

a step of S307 of forming a second organic layer on the flexible substrate using a coating process or an ink printing process;

a step of S308 of forming a second inorganic film on the flexible substrate through a third mask; and a step of S309 of forming a second dividing film on the flexible substrate through a fourth mask, wherein the second dividing film and the second inorganic film constitute a second sub-body mixing layer.

The method for manufacturing an OLED flexible display panel according to this embodiment of the present disclosure is explained in detail, as described below.

In step S301, a flexible substrate is provided. The flexible substrate can be made of ultra-thin glass or polymer.

In step S302, an OLED luminescent structure is formed on the flexible substrate. The OLED luminescent structure includes elements such as an anode, a hole injection layer, a hole transport layer, a light-emitting layer, an electron transport layer, an electron injection layer and a cathode, etc.

In step S303, a bulk inorganic layer is formed on the OLED luminescent structure using an atomic layer deposition process. The bulk inorganic layer constitutes an inorganic particulate cover on the surface of the OLED luminescent structure, which is used as an ultra-thin and dense moisture-blocking layer. The bulk inorganic layer can be an aluminum oxide ($Al_2O_3$) layer or a silicon nitride ($SiN_x$) layer. The bulk inorganic layer has a thickness ranging from 10 nanometer to 500 nanometer.

In step S304, a first organic layer is formed on the bulk inorganic layer using a coating process or an ink printing process. The first organic layer can be an acrylate-based polymer layer, a styrene-based polymer layer, or an organic silicon-based polymer layer. The first organic layer is not only functioned to planarize to the bulk inorganic layer but used as a buffer layer for releasing stress existing in adjacent inorganic layers. The first organic layer has a thickness ranging from 5 micrometer to 10 micrometer.

In step S305, a first inorganic film of a first sub-body mixing layer is formed on the first organic layer through a first mask having a pattern of the first inorganic film.

In step S306, a first dividing film of the first sub-body mixing layer is formed on the first organic layer through a second mask having a pattern of the first dividing film. A length of the first inorganic film in bending direction of the OLED flexible display panel is greater than a length of the first dividing film in bending direction of the OLED flexible display panel. The thickness of the first inorganic film can be the same as or different from that of the first dividing film.

Therefore, a first sub-body mixing layer having a soft-rigid-soft-rigid structure is formed. The first dividing film of the first sub-body mixing layer has a small elastic modulus, therefore, during bending process of the OLED flexible display panel, the first dividing film can absorb tensile stress or compressive stress existing in the first sub-body mixing layer and adjacent structures, so as to avoid the first sub-body mixing layer from cracking or peeling. The first inorganic film of first sub-body mixing layer can be an aluminum oxide layer, a silicon nitride layer, a silicon oxide layer, or a silicon carbide layer. The first dividing film of the first sub-body mixing layer can be an organic film (such as an acrylate-based polymer layer, a styrene-based polymer layer, an organic silicon-based polymer layer, etc.) or an inorganic film (such as an aluminum oxide layer, a silicon nitride layer, a silicon oxide layer, a silicon carbide layer, etc.). The first inorganic film and the first dividing film of the first sub-body mixing layer each has a thickness ranging from 0.1 micrometer to 10 micrometer.

In step S307, a second organic layer is formed on the first sub-body mixing layer using a coating process or an ink printing process. The second organic layer can be an acrylate-based polymer layer, a styrene-based polymer layer, or an organic silicon-based polymer layer. The second organic layer is not only functioned to planarize the first sub-body mixing layer but used as a buffer layer for releasing stress existing in adjacent inorganic layers. The second organic layer has a thickness ranging from 5 micrometer to 10 micrometer.

In step S308, a second inorganic film of a second sub-body mixing layer is formed on the second organic layer through a third mask having a pattern of the second inorganic film.

In step S309, a second dividing film of the second sub-body mixing layer is formed on the second organic layer through a fourth mask having a pattern of the second dividing film. A length of the second inorganic film in bending direction of the OLED flexible display panel is greater than a length of the second dividing film in bending direction of the OLED flexible display panel. The thickness of the second inorganic film can be the same as or different from that of the second dividing film.

Therefore, a second sub-body mixing layer having a soft-rigid-soft-rigid structure is formed. The second dividing film of the second sub-body mixing layer has a small elastic modulus, therefore, during bending process of the OLED flexible display panel, the second dividing film can absorb tensile stress or compressive stress existing in the second sub-body mixing layer and adjacent structures, so as to avoid the second sub-body mixing layer from cracking or peeling. The second inorganic film of second sub-body mixing layer can be an aluminum oxide layer, a silicon nitride layer, a silicon oxide layer, or a silicon carbide layer. The second dividing film of the second sub-body mixing layer can be an organic film (such as an acrylate-based polymer layer, a styrene-based polymer layer, an organic silicon-based polymer layer, etc.) or an inorganic film (such as an aluminum oxide layer, a silicon nitride layer, a silicon oxide layer, a silicon carbide layer, etc.). The second inorganic film and the second dividing film of the second sub-body mixing layer each has a thickness ranging from 0.1 micrometer to 10 micrometer.

A projection of the first dividing film on a planar plane (or curved plane) of the flexible substrate does not overlap a projection of the second dividing film on the planar plane (or curved plane) of the flexible substrate. This makes the first sub-body mixing layer and the second sub-body mixing layer eliminate stresses at different regions of the OLED flexible display panel, respectively, therefore operation stability of the OLED flexible display panel is increased.

The method for manufacturing an OLED flexible display panel according to this embodiment of the present disclosure is thus completed.

Preferably, the method further includes a step, inserted between step S302 and step S303, of forming an inorganic protective layer for protecting the OLED luminescent structure. The inorganic protective layer can be made of LiF that is formed by thermal evaporation.

According to the OLED flexible display panel and the method for manufacturing the same of the present disclosure, because a laminate structure having sub-body inorganic layers and organic layers is formed in the OLED flexible display panel to block water and oxygen, it is difficult for the inorganic film in the OLED flexible display panel to crack or peel, thus solving the problems encountered by the prior art where the inorganic film in the OLED flexible display panel is liable to crack and peel during bending process of OLED flexible display panel.

In summary, while the present disclosure has been described with the aforementioned preferred embodiments, it is preferable that the above embodiments should not be construed as limiting of the present disclosure. Anyone having ordinary skill in the art can make a variety of modifications and variations without departing from the spirit and scope of the present disclosure as defined by the following claims.

What is claimed is:

1. An organic light-emitting diode (OLED) flexible display panel, comprising:
   a flexible substrate;
   an OLED luminescent structure disposed on the flexible substrate;
   a bulk inorganic layer disposed on the OLED luminescent structure;
   a first organic layer directly disposed on the bulk inorganic layer;
   a first sub-body mixing layer directly disposed on the first organic layer, wherein the first sub-body mixing layer comprises a first inorganic film and a first dividing film that are alternately arranged;
   a second organic layer directly disposed on the first sub-body mixing layer; and
   a second sub-body mixing layer directly disposed on the second organic layer, wherein the second sub-body mixing layer comprises a second inorganic film and a second dividing film that are alternately arranged;
   wherein the first dividing film is an inorganic film or an organic film having an elastic modulus less than an elastic modulus of the first inorganic film; and
   wherein the second dividing film is an inorganic film or an organic film having an elastic modulus less than an elastic modulus of the second inorganic film.

2. The OLED flexible display panel according to claim 1, wherein a length of the first inorganic film is greater than a length of the first dividing film, and a length of the second inorganic film is greater than a length of the second dividing film.

3. The OLED flexible display panel according to claim 1, wherein a projection of the first dividing film on a plane of the flexible substrate does not overlap a projection of the second dividing film on the plane of the flexible substrate.

4. The OLED flexible display panel according to claim 1, wherein the bulk inorganic layer is disposed on the OLED luminescent structure by an atomic layer deposition process.

5. The OLED flexible display panel according to claim 1, wherein the first organic layer is disposed on the bulk inorganic layer by a coating process or an ink printing process; and the second organic layer is disposed on the first sub-body mixing layer by a coating process or an ink printing process.

6. The OLED flexible display panel according to claim 1, wherein the bulk inorganic layer is an aluminum oxide layer or a silicon nitride layer; the first organic layer and the second organic layer are selected from an acrylate-based polymer layer, a styrene-based polymer layer, or an organic silicon-based polymer layer; and the first inorganic film and the second inorganic film are selected from an aluminum oxide layer, a silicon nitride layer, a silicon oxide layer, or a silicon carbide layer.

7. The OLED flexible display panel according to claim 1, wherein the OLED flexible display panel further comprises:
   an inorganic protective layer disposed between the OLED luminescent structure and the bulk inorganic layer.

* * * * *